United States Patent
Chen

(10) Patent No.: US 7,279,716 B2
(45) Date of Patent: Oct. 9, 2007

(54) SINGLE-CHIP LED WITH THREE LUMINESCENT SPECTRUMS OF RED, BLUE AND GREEN WAVELENGTHS

(75) Inventor: Cheng Chuan Chen, Tainan County (TW)

(73) Assignee: Genesis Photonics Inc., Tainan (TW)

( * ) Notice: Subject to any disclaimer, the term of this patent is extended or adjusted under 35 U.S.C. 154(b) by 357 days.

(21) Appl. No.: 11/106,134

(22) Filed: Apr. 13, 2005

(65) Prior Publication Data

US 2005/0230693 A1 Oct. 20, 2005

(30) Foreign Application Priority Data

Apr. 14, 2004 (TW) ............................... 93110390 A

(51) Int. Cl.
*H01L 29/32* (2006.01)
*H01L 33/00* (2006.01)
(52) U.S. Cl. ............................. 257/94; 257/79; 257/98; 438/65; 313/506
(58) Field of Classification Search .................. 257/79, 257/94, 98; 438/65; 313/506, 507
See application file for complete search history.

(56) References Cited

U.S. PATENT DOCUMENTS 6,448,709 B1 * 9/2002 Chuang et al. ............. 313/497
6,927,426 B2 * 8/2005 Matsuoka et al. .......... 257/103

* cited by examiner

Primary Examiner—Fernando L. Toledo
(74) Attorney, Agent, or Firm—Christensen O'Connor Johnson Kindness PLLC

(57) ABSTRACT

The present invention relates to a single-chip light-emitting diode (LED) with three luminescent spectrums of red, blue and green wavelengths. The single-chip light-emitting diode of the invention comprises a base, two conductive pins, a single-chip light-emitting element, a package material, and red fluorescent powder. The single-chip light-emitting element is disposed on the base and electrically connected to the two conductive pins. The red fluorescent powder is added to the package material. The single-chip light-emitting element comprises a substrate, an N-type cladding layer, a P-type cladding layer, at least one green light-emitting layer, and at least one blue light-emitting layer. The green light-emitting and blue light-emitting layers are formed between the N-type cladding layer and the P-type cladding layer. According to the single-chip LED of the present invention, the green and blue light spectrums are direct light sources respectively supplied for the blue light-emitting layer and the green light-emitting layer of the single-chip light-emitting element. The red light spectrum is a red light generated by exciting the red fluorescent powder with the blue or green light or their combination of the single-chip light-emitting element. Therefore, the single-chip LED with the three luminescent spectrums of red, blue and green wavelengths may be applied to the backlight source of the liquid crystal display module to provide the properties of high color-rendering, preferred power-saving and small volume.

17 Claims, 10 Drawing Sheets

SINGLE-CHIP LED WITH THREE LUMINESCENT SPECTRUMS OF RED, BLUE AND GREEN WAVELENGTHS

BACKGROUND OF THE INVENTION

1. Field of the Invention

The present invention relates to a single-chip light-emitting diode (LED), and particularly, to a single-chip LED with three spectrums of red, blue and green wavelengths.

2. Description of the Related Art

In recent years, there is an increasing demand for full color display electronic products, such as mobile phones, digital cameras, digital camcorders, personal digital assistants (PDAs) or the portable computers and the like, to be light and small as well as power-saving. Therefore, conventional application of a cold cathode fluorescent lamp (CCFL) as the backlight source of the LDC screen may fail to meet the property required by the design, and it is desirable to develop a new backlight source for the LCD screen.

At present, in the full color LCD technology, the designs for either the STN-LCD or the TFT-LCD and the like employ a white light backlight source, and three pixels of red, blue and green may be generated by controlling the lights passing through the RGB Color filter. Traditionally, a white light source employs a CCFL as the backlight source of the LCD screen, but due to its high power consumption, the CCFL has a large volume, and in use the direct current (DC) should be inverted to AC voltage by the inverter. Moreover, CCFL causes mercury pollution to the environment. Therefore, for the small and medium sized portable electronic products, CCFL is not the best choice for a backlight source.

Therefore, the technicians began to consider using LED instead of CCFL, since LED has various advantages of small volume, low power consumption and no environmental contaminations, and it may obtain a better color-rendering performance through modulating the wavelengths of the red, blue and green lights.

The earliest conventional technique is to provide three wavelengths of the red, blue and green lights using the red, blue and green chips package. Theoretically, this method is the most preferred choice for the LCD back light source. Because the red, blue and green lights are provided directly, no red, blue and green color filters are needed to generate the desired light source. However, since the red light material differs from the blue and green light material, and according to this method, the circuit is complex and expensive, it is difficult to achieve the consistency of the light and color, and the attenuation rates of the three colors varying from each other lead to an unstable quality, so that the operation complexity and the cost of this method are much higher than the CCFL, and therefore it is not the best choice for the portable electronic backlight source.

The technology used for a majority of small sized LCD backlight sources in the market is the white light element technology developed by Nichia Chemical, with reference to ROC patent certificate No. 383508 and its U.S. equivalent U.S. Pat. No. 5,998,925. In the white light element technology, a blue LED is packaged together with fluorescent powder of its complementary color, and after the fluorescent powder of its complementary color is excited by the blue light, the generated complementary color for blue light is blended with the remaining blue light unabsorbed by the fluorescent powder, thus to generate the white light source which may be used as the white backlight source. Because the spectrum of the complementary color for blue light is mainly yellow wavelength, the ratio of the desired green to the red light source resulted from the color filter is not high, thereby leading to a problem of insufficient light intensity on the LCD backlight source.

Furthermore, the ROC patent certificate No. 172159 discloses a white LED element with the spectrums of three wavelengths, and a method which uses a UV LED to excite the red, blue and green fluorescent powder. In this method, the luminance performance is poor, since the UV AlGaN LED has a short life. Furthermore, three kinds of fluorescent powders with different photoelectrical properties and lives are simultaneously used so that the color and life reliability decreases. In addition, the UV light has to excite the fluorescent powders of three colors at a time.

Moreover, the ROC patent certificate No. 563261 discloses that a blue LED is used to excite the green and red fluorescent powder. Because the absorption and the conversion rates of the majority of red and green fluorescent powders for the blue light are rather poor, the light intensity is insufficient when these two kinds of fluorescent powders are excited by a single blue light source at a time.

Therefore, it is necessary to provide a single-chip LED with three luminescent spectrums of red, blue and green wavelengths to solve the above mentioned problems.

SUMMARY OF THE INVENTION

One objective of the present invention is to provide a single-chip LED with three luminescent spectrums of red, blue and green wavelengths, comprising a base, two conductive pins, a single-chip light-emitting element, a package material, and red fluorescent powder. The single-chip light-emitting element is disposed on the base, and is electrically connected to the two conductive pins. The package material is used for packaging the single-chip light-emitting element. The red fluorescent powder is added to the package material, wherein the single-chip light-emitting element includes a substrate, an N-type cladding layer, a P-type cladding layer, at least one green-light-emitting layer, and at least one blue-light-emitting layer. The green-light-emitting layer and blue-light-emitting layer are formed between the N-type cladding layer and the P-type cladding layer.

The a single-chip LED with the three luminescent spectrums of red, blue and green wavelengths of the invention, green and blue spectrums are direct light sources respectively supplied for the blue and green-light-emitting layers of the single-chip light-emitting element. The red light spectrum is a red light generated by exciting red fluorescent powder with the blue light or the green light or their combination of the single-chip light-emitting element. Therefore, the single-chip LED with the three luminescent spectrums of red, blue and green wavelengths may be applied to the backlight source of the liquid crystal display module, lights, decorative lights and indicative lights with warm white light so as to provide the properties of high color-rendering, preferred power-saving and small volume.

DETAILED DESCRIPTION OF THE INVENTION

With reference to the drawings, the single-chip LED and the single-chip light-emitting element with three luminescent spectrums of red, blue and green wavelengths will be illustrated according to the embodiments of the present invention. In these drawings, the same or similar parts are indicated with the same or similar reference numbers and titles. In addition, the drawings are only schematic views for illustration, thus the proportion of the structure size may vary from that of the real structure size.

Figure 1:
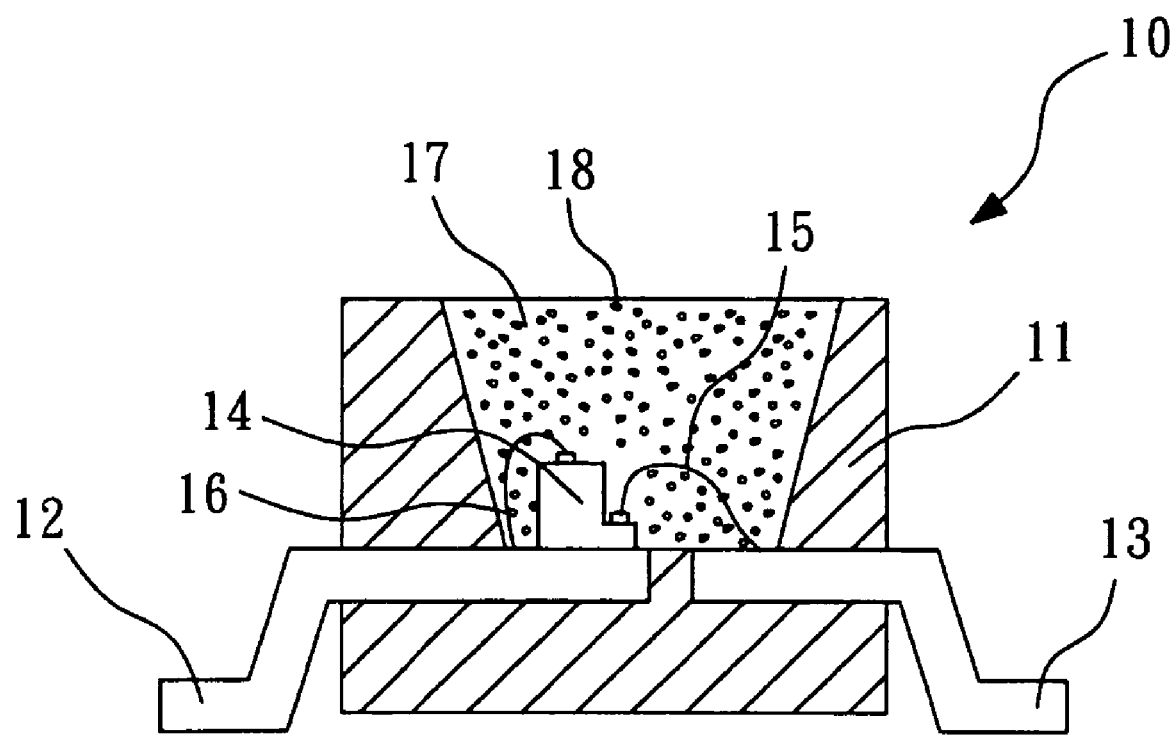
FIG. 1 is a schematic view, illustrating the structure of the single-chip LED with three luminescent spectrums of red, blue and green wavelengths according to the present invention.

Referring to FIG. 1, the construction of the single-chip LED 10 with three luminescent spectrums of red, blue and green wavelengths according to the present invention is illustrated. The single-chip LED 10 with three luminescent spectrums of red, blue and green wavelengths comprises a base 11, two conductive pins 12 and 13, a single-chip light-emitting element 14, a package material 17, and a red fluorescent powder 18. The single-chip light-emitting element 14 is disposed on the base 11 and electrically connected to the conductive pins 12, 13 by two wires 15, 16. The package material 17 is used to package the single-chip light-emitting element 14. The red fluorescent powder 18 is added to the package material 17. The base 11 is made from nontransparent material, while the package material 17 is made from transparent material (e.g. epoxy).

The single-chip light-emitting element 14 comprises a substrate, a buffer layer, a first conductive cladding layer, a second conductive cladding layer, at least one green-light-emitting layer, and at least one blue-light-emitting layer. The buffer layer is formed on the substrate. The first conductive cladding layer is formed on the buffer layer. The green-light-emitting layer and the blue-light-emitting layer are formed between the first conductive cladding layer and the second conductive cladding layer. The structure of the single-chip light-emitting element 14 will be illustrated in detail hereinafter.

Figure 2:
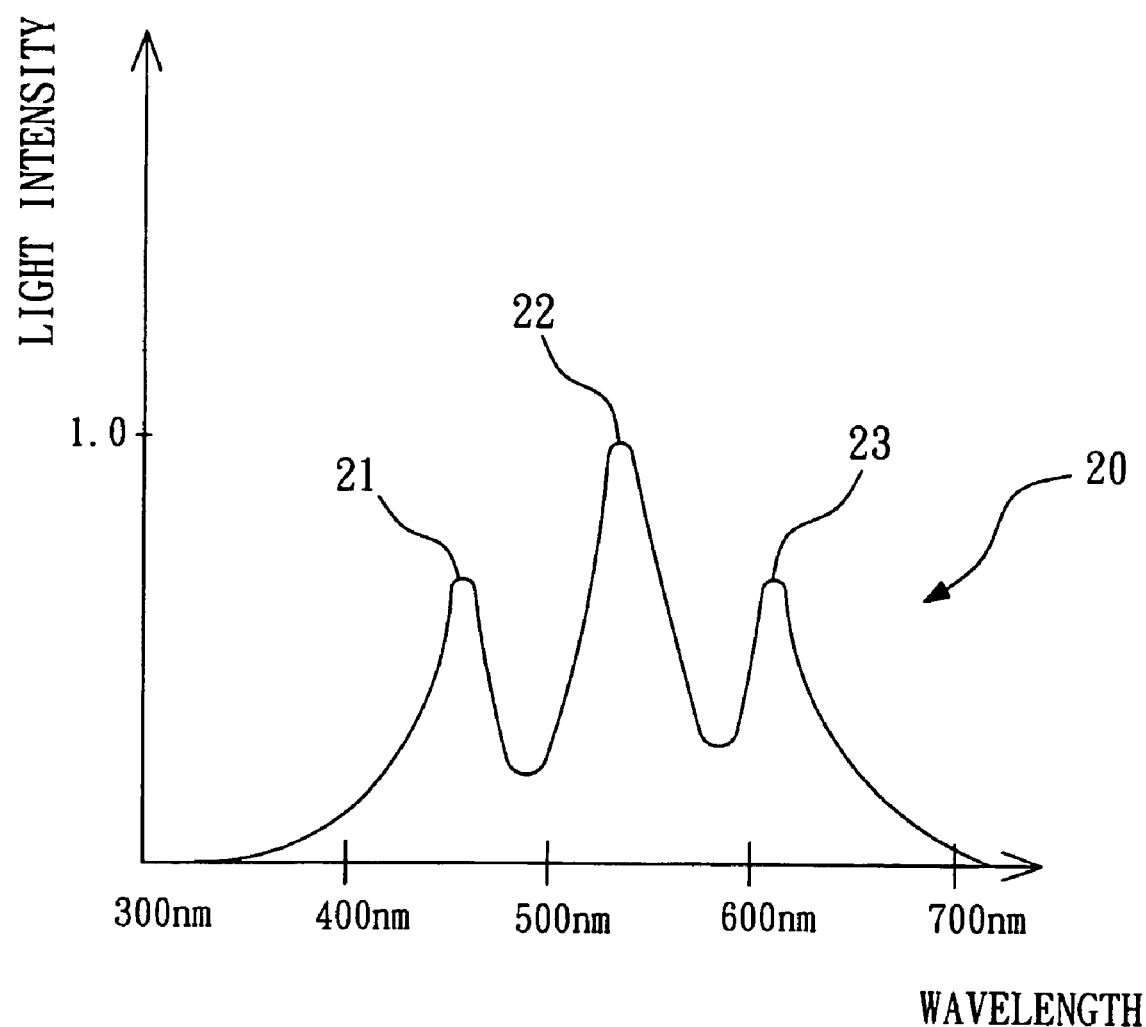
FIG. 2 is a distribution view illustrating the light intensity and light luminescent spectrums of the single-chip LED with three spectrums of red, blue and green wavelengths according to the present invention.

Referring to FIG. 2, a distribution curve 20 of the light-emitting intensity and the luminescent spectrum of the single-chip LED with three spectrums of red, blue and green wavelengths according to the present invention is shown. The spectrum distribution curve 20 involves a blue light spectrum 21, a green light spectrum 22, and a red light spectrum 23, wherein the blue light spectrum 21 and the green light spectrum 22 are direct light sources respectively provided for the blue-light-emitting layer and the green-light-emitting layer of the single-chip light-emitting element. The blue light spectrum 21 is ranging from 400 nm to 495 nm, while the green light spectrum 22 is ranging from 510 nm to 585 nm. The red light spectrum 23 is a red light generated by exciting the red fluorescent powder with the blue light or green light or their combination of the single-chip light-emitting element. The red light spectrum 23 is ranging from 585 nm to 710 nm. Therefore, the single-chip LED with three luminescent spectrums of red, blue and green wavelengths may be applied to the backlight source of the liquid crystal display module, lights, decorative lights and indicative lights with warm white light so as to provide the properties of high color-rendering, preferred power-saving and small volume.

Figure 3:
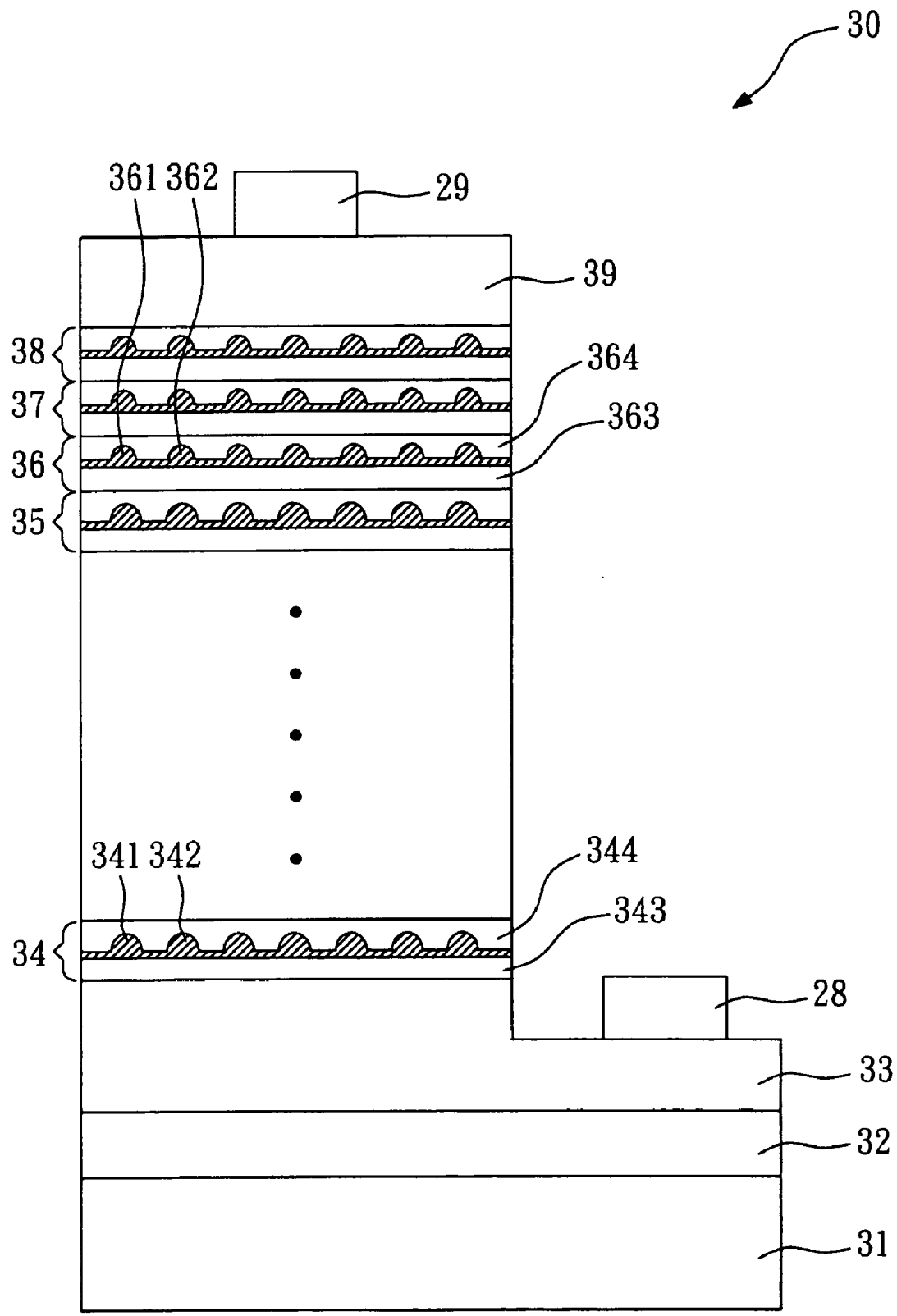
FIG. 3 is a schematic view illustrating the structure of the single-chip light-emitting element in the first embodiment according to the present invention.

Referring to FIG. 3, the construction of the single-chip light-emitting element 30 of the first embodiment according to the present invention is illustrated. The single-chip light-emitting element 30 comprises a substrate 31, a buffer layer 32, a first conductive cladding layer 33, seven green quantum-dot light-emitting layers 34, 35 etc., three blue quantum-dot light-emitting layers 36, 37, 38, and a second conductive cladding layer 39. The single-chip white light element 30 further comprises two electrodes 28, 29 to connect to the two conductive pins 12, 13 with the wires 15, 16 of FIG. 1.

The buffer layer 32 is formed on the substrate 31. The first conductive cladding layer 33 is formed on the buffer layer 32, and may be an N-type cladding layer for supplying electrons. The second conductive cladding layer 39 is formed on the blue quantum-dot light-emitting layer 38, and may be a P-type cladding layer for supplying electron holes. All of the buffer layer 32, the first conductive cladding layer 33 and the second conductive cladding layer 39 are of AlGaN structures, represented as $Al_{(1-x-y)}In_yGa_xN$.

The seven green quantum-dot light-emitting layers 34, 35 etc. are sequentially formed on the first conductive cladding layer 33. Taking the green quantum-dot light-emitting layer 34 as an example, it has a plurality of quantum dots 341, 342. The quantum-dot light-emitting layer 34 further comprises a first barrier layer 343 and a second barrier layer 344. The first barrier layer 343 is below the quantum dots 341, 342, while the second barrier layer 344 is above the quantum dots 341, 342. Both the first barrier layer 343 and the second barrier layer 344 are of AlGaN structures, represented as $Al_{(1-x-y)}In_yGa_xN$. The energy barriers of both the first barrier layer 343 and the second barrier layer 344 must be larger than those of the quantum dots 341, 342.

Three blue quantum-dot light-emitting layers 36, 37, 38 are sequentially arranged on the green quantum-dot light-emitting layer 35. Each blue quantum-dot light-emitting layer is provided with a plurality of quantum dots. Taking the blue quantum-dot light-emitting layer 36 as an example, it has a plurality of quantum dots 361, 362, a first barrier layer 363, and a second barrier layer 364.

Figure 4:
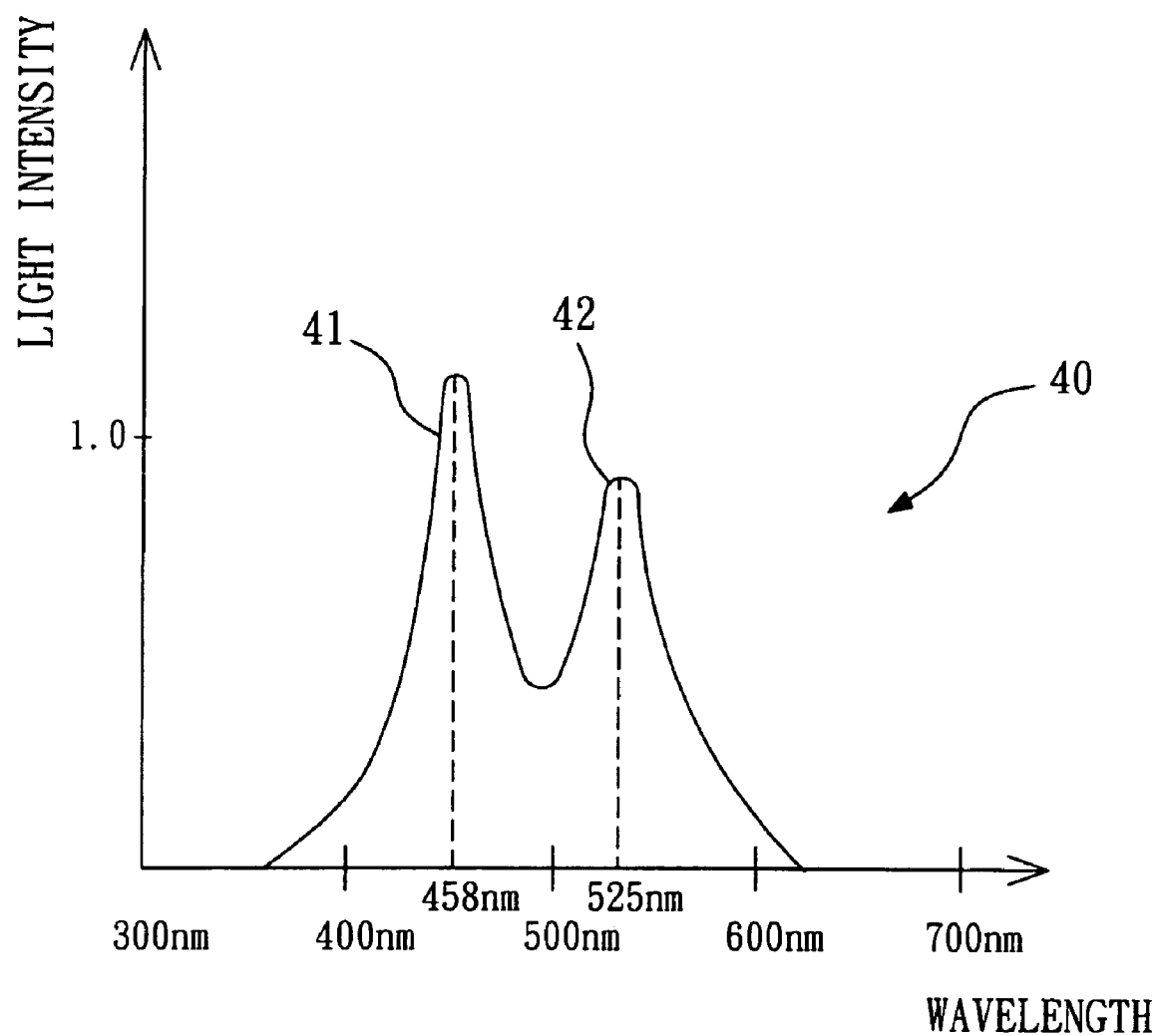
FIG. 4 is a distribution view illustrating the light intensity and light spectrums of the single-chip light-emitting element in the first embodiment according to the present invention.

Referring to FIG. 4, the spectrum distribution curve 40 of the single-chip light-emitting element 30 involves a blue light spectrum 41 and a green light spectrum 42. The blue light spectrum 41 and the green light spectrum 42 are direct light sources respectively provided for the blue-light-emitting layers and the green-light-emitting layers of the single-chip light-emitting element 30, wherein the emission wavelength of the maximum light-emitting intensity of the blue quantum-dot light-emitting layer is 458 nm; the emission wavelength of the maximum light-emitting intensity of the green quantum-dot light-emitting layer is 525 nm. The single-chip light-emitting element 30 is provided with both a green quantum-dot light-emitting layer and a blue quantum-dot light-emitting layer in one light-emitting structure, so that the single-chip light-emitting element 30 may be provided with a property of dual-wavelength spectrum.

The single-chip light-emitting element 30 employs the light-emitting layer of the quantum dot structure, of which the blended light property is better than the conventional art using the quantum well, and is not limited to the provision that the blended light effect of different wavelengths can be obtained by reducing the tunnel effect of the shield layer. Therefore, the blended light effect and the light-emitting intensity of the light-emitting layer with multiple wavelengths grown in a single chip structure may be improved by the quantum-dot light-emitting layer technology. Moreover, the blended light proportion between different light-emitting layers may be controlled by dominating the quantum dot distribution density of the quantum-dot light-emitting layer.

Moreover, the FWHM (full width at half maximum) of the emission wavelength spectrum for the blue quantum-dot light-emitting layer or the green quantum-dot light-emitting layer may be controlled by the quantum dot size or the content of indium, thereby obtaining the property with wide spectrum by modulating the quantum dot size or the content of indium and controlling non-uniform distribution property of the quantum dots. The technical feature that wide spectrum property may be obtained by controlling the non-uniform distribution property of the quantum dots has been disclosed in the patent application ser. No. 092123734, and will not be repeated herein.

In the first embodiment, the single-chip light-emitting element 30 employs the structure of seven green quantum-dot light-emitting layers and three blue quantum-dot light-emitting layers. However, the present invention is not limited to such light-emitting layer structure. In the present invention, the blue light-emitting layers of the single-chip light-emitting element 30 adjacent to the P-type cladding layer 39 must be of the quantum dot structure, and the green light-emitting layer away from the P-type cladding layer 39 may be of either the quantum dot structure or the quantum well structure.

Figure 5:
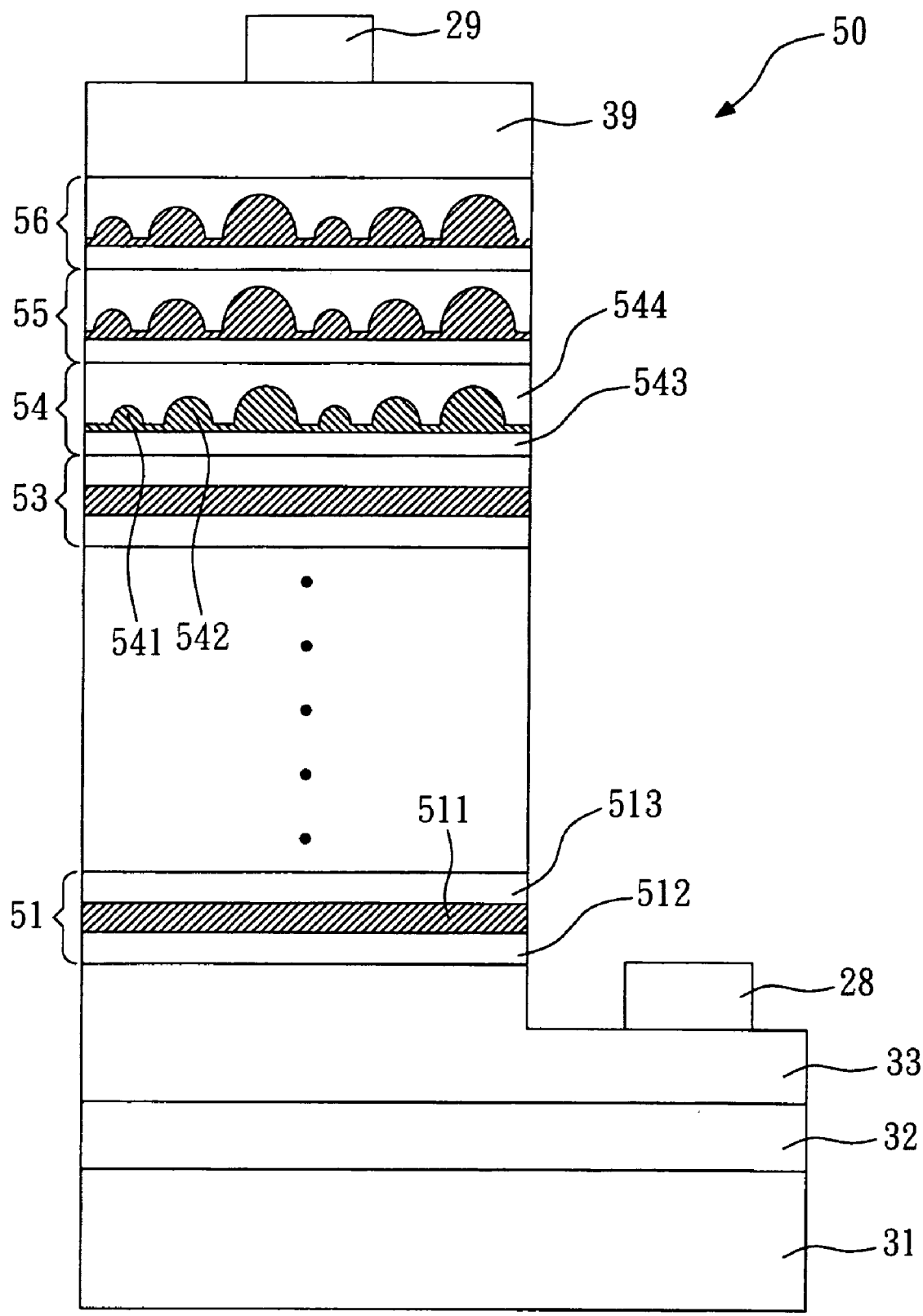
FIG. 5 is a schematic view illustrating the structure of the single-chip light-emitting element in the second embodiment according to the present invention.

Referring to FIG. 5, a single-chip light-emitting element 50 of the second embodiment according to the present invention is shown. In FIG. 5, the parts the same as those in the structure of the first embodiment are indicated by the same reference numbers, and may have the same construction and same function, unless otherwise specified.

As shown in FIG. 5, the single-chip light-emitting element 50 of the second embodiment according to the present invention is between the first conductive cladding layer 33 and the second conductive cladding layer 39, comprising four blue quantum-well light-emitting layers 51, 53 etc. and three green quantum-dot light-emitting layers 54, 55 and 56, wherein the four blue quantum-well light-emitting layers 51, 53 etc. are sequentially formed on the first conductive cladding layer 33 (N-type cladding layer). Taking the blue quantum-well light-emitting layer 51 as an example, the blue quantum-well light-emitting layer 51 is provided with a quantum well structure 511 and two barrier layers 512 and 513.

Three green quantum-dot light-emitting layers 54, 55 and 56 are sequentially formed on the blue quantum-dot light-emitting layers 53. Also, each green quantum-dot light-emitting layer is provided with a plurality of quantum dots. Taking the green quantum-dot light-emitting layer 54 as an example, it has a plurality of quantum dots 541, 542 and two barrier layers 543, 544. Moreover, the quantum dots of each layer is designed to be distributed non-uniformly, thus the quantum dots have a non-uniform property distribution, so that the FWHM of the emission wavelength spectrums of the quantum-dot light-emitting layers 54, 55 and 56 are increased.

Figure 6:
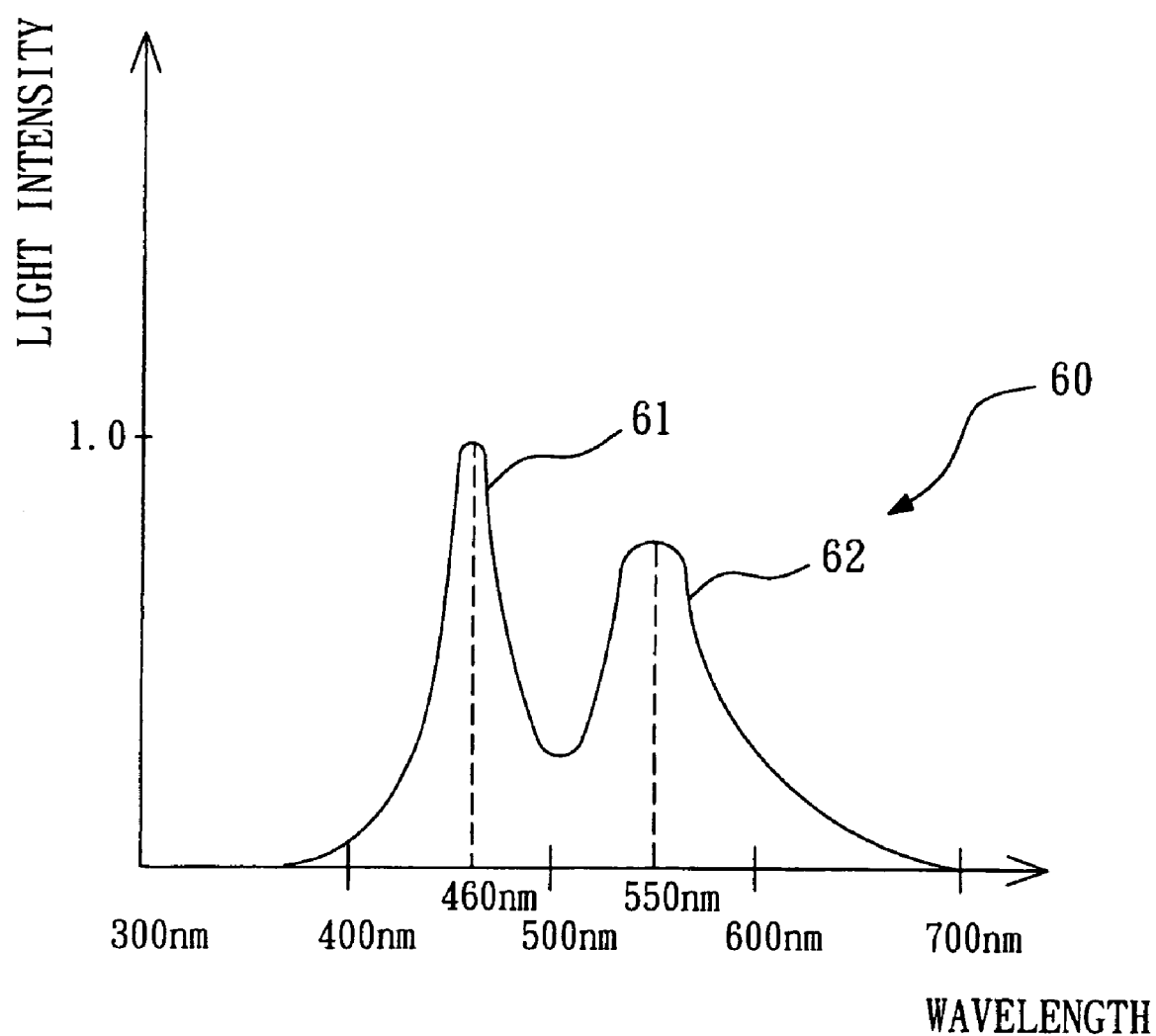
FIG. 6 is a distribution view illustrating the light intensity and light spectrums of the single-chip light-emitting element in the second embodiment according to the present invention.

Referring to FIG. 6, the spectrum distribution curve 60 of the single-chip light-emitting element 50 involves a blue light spectrum 61 and a green light spectrum 62. The blue light spectrum 61 and the green light spectrum 62 are direct light sources respectively provided for the blue light-emitting layers and the green emitting layers of the single-chip light-emitting element 50, wherein the emission wavelength of the maximum light-emitting intensity of the blue quantum-dot light-emitting layers is 460 nm; the emission wavelength of the maximum light-emitting intensity of the green quantum-dot light-emitting layers is 550 nm. In addition, the three green quantum-dot light-emitting layers may be provided with a property of broad-wavelength spectrum.

The single-chip light-emitting element 50 of the second embodiment according to the present invention is different from that of the first embodiment. The single-chip light-emitting element 50 of the second embodiment employs a quantum well structure as the blue light-emitting layer, rather than employing a quantum dot structure. Since the structure of the single-chip light-emitting element 50 has both the green quantum-dot light-emitting layer and the blue quantum-well light-emitting layer at a time, the single-chip light-emitting element 50 may also be provided with the dual-wavelength property. Therefore, for the single-chip light-emitting element 50 of the second embodiment, the blue light-emitting layer which is far way from the P-type cladding layer 39 may employ a quantum well structure.

Figure 7:
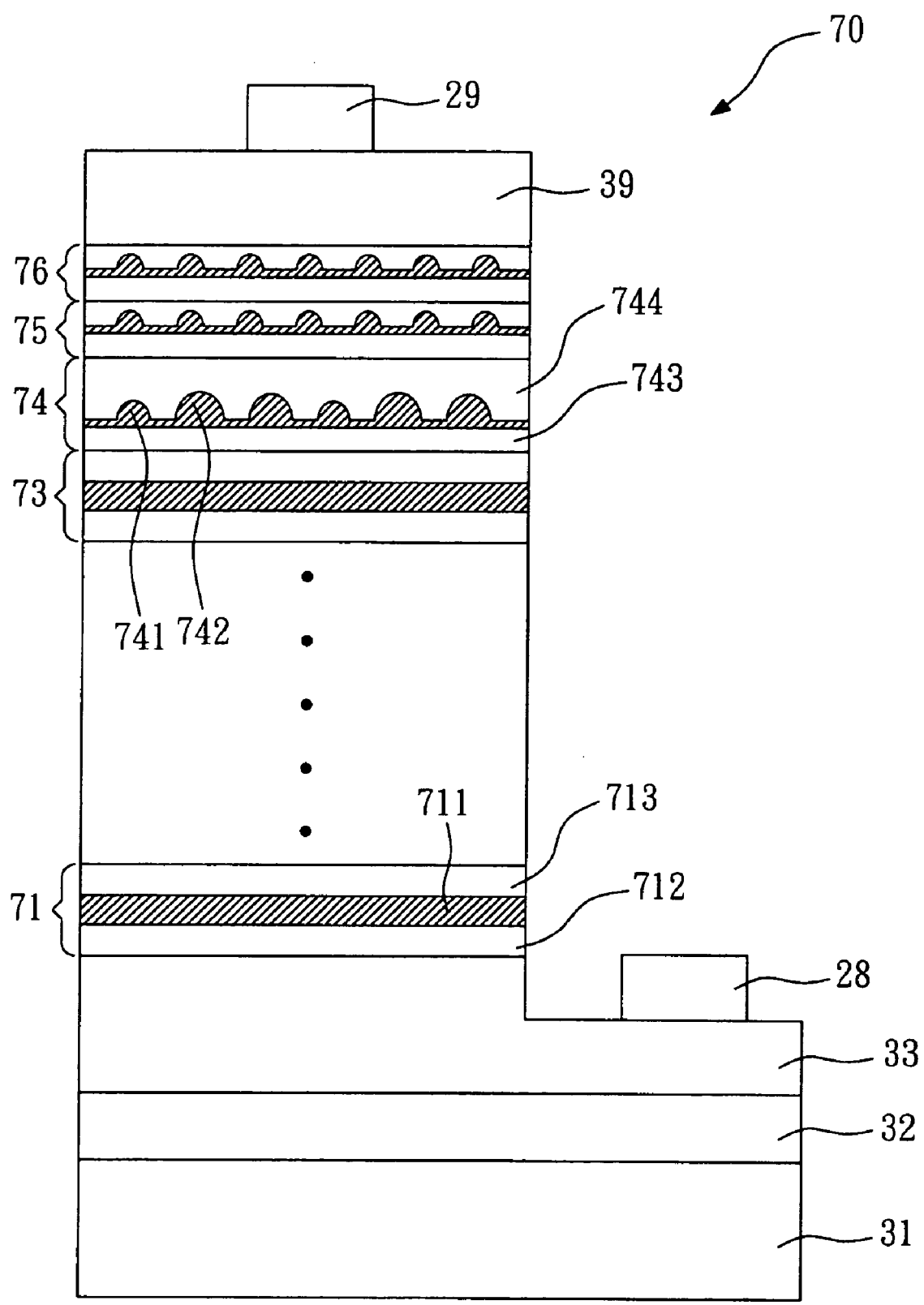
FIG. 7 is a schematic view illustrating the structure of the single-chip light-emitting element in the third embodiment according to the present invention.

Referring to FIG. 7, the single-chip light-emitting element 70 of the third embodiment according to the present invention is between the first conductive cladding layer 33 and the second conductive cladding layer 39, comprising seven green quantum-well light-emitting layers 71, 73 etc., a blue quantum-dot light-emitting layer 74, and two ultraviolet quantum-dot light-emitting layers 75 and 76. The seven green quantum-well light-emitting layers 71, 73 etc. are sequentially formed on the first conductive cladding layer 33 (N-type cladding layer). Taking the green quantum-well light-emitting layer 71 as an example, the green quantum-well light-emitting layer 71 is provided with a quantum well structure 711 and two barrier layers 712 and 713.

A blue quantum-dot light-emitting layer 74 is disposed on the green quantum-well light-emitting layer 73. The blue quantum-dot light-emitting layer 74 has a plurality of quantum dots 741, 742 and two barrier layers 734, 744. Two ultraviolet quantum-dot light-emitting layers 75, 76 are disposed on the blue quantum-dot light-emitting layer 74. Such ultraviolet quantum-dot light-emitting layers are also provided with a plurality of quantum dots and two barrier layers.

Figure 8:
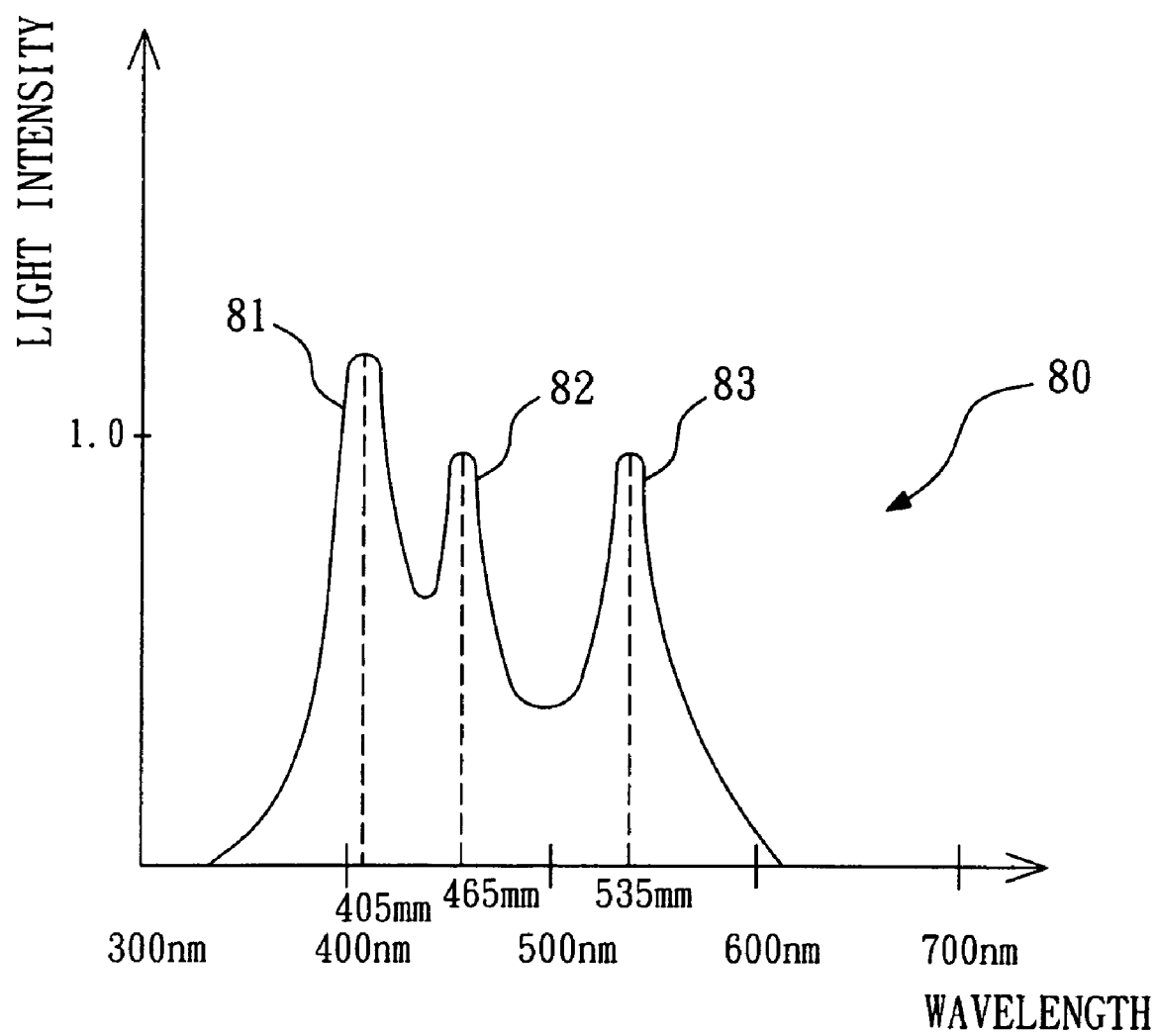
FIG. 8 is a distribution view illustrating the light intensity and light spectrums of the single-chip light-emitting element in the third embodiment according to the present invention.

Referring to FIG. 8, the spectrum distribution curve 80 of the single-chip light-emitting element 70 involves a UV light spectrum 81, a blue light spectrum 82 and a green light spectrum 83. The UV light spectrum 81, the blue light spectrum 82 and the green light spectrum 83 are direct light sources respectively provided for the UV light-emitting layer, blue-light-emitting layer and green-light-emitting layer of the single-chip light-emitting element 70, wherein the emission wavelength of the maximum light-emitting intensity of the UV quantum-dot light-emitting layers is 405 nm; the emission wavelength of the maximum light-emitting intensity of the blue quantum-dot light-emitting layer is 465 nm; the emission wavelength of the maximum light-emitting intensity of the green quantum-dot light-emitting layers is 535 nm.

Therefore, the single-chip light-emitting element 70 of the third embodiment can generate three wavelengths (UV light, blue light and green light). If the single-chip light-emitting element 70 of the third embodiment is used as the single-chip light-emitting element 14 of FIG. 1, the red fluorescent powder 18 in the single-chip LED 10 of FIG. 1 may be excited separately by the blue, green or UV light, or excited by any two of these three excitation sources, or excited by the three sources at the same time so as to generate the red light, to increase the light-emitting intensity. The range of the wavelength of the UV light from the UV light-emitting layer is from 250 nm to 400 nm, the range of the wavelength of the blue light from the blue light-emitting layer is from 400 nm to 495 nm, and the range of the wavelength of the green light from the green light-emitting layer is from 510 nm to 585 nm.

Figure 9:
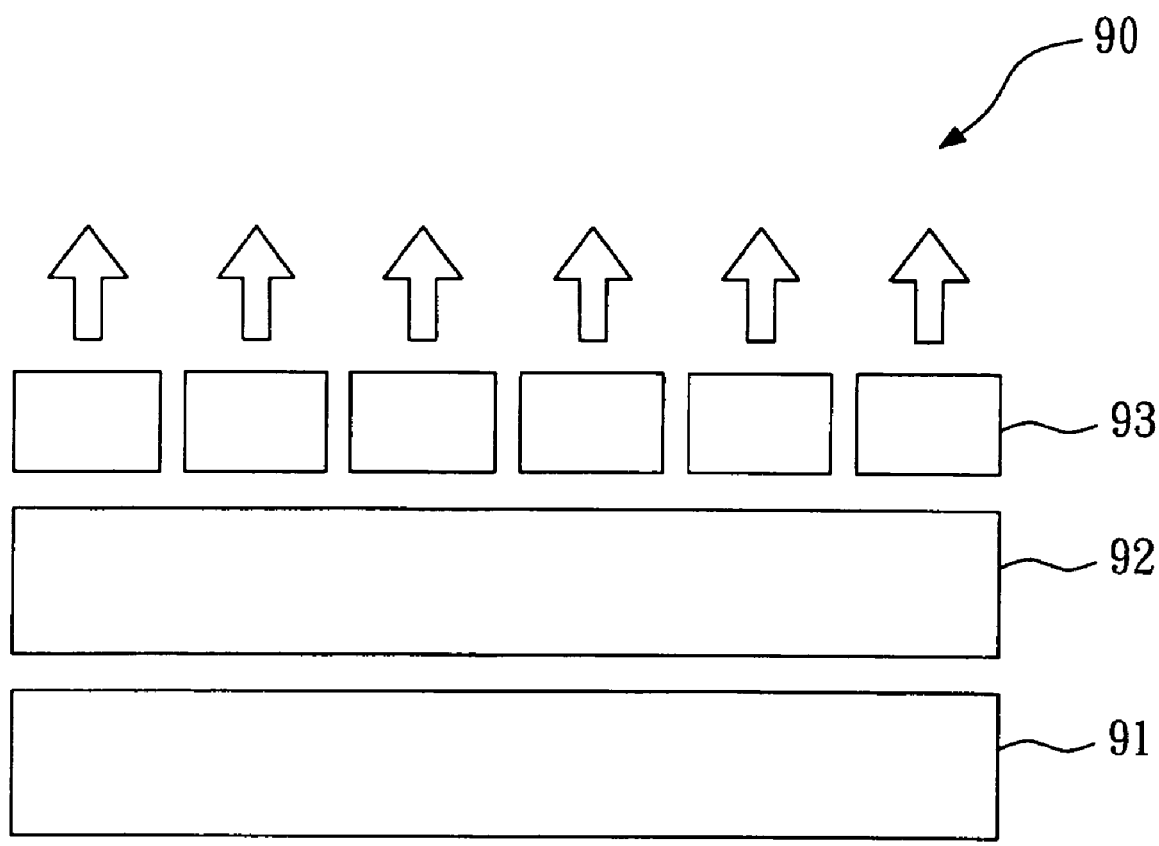
FIG. 9 is a schematic view illustrating the structure of the single-chip light-emitting element applied to the display according to the present invention.

The single-chip LED with three luminescent spectrums of red, blue and green wavelengths according to the present invention may be applied to the back light of the liquid crystal display module. Referring to FIG. 9, a display 90 comprises a backlight source 91, a liquid crystal unit module 92, and a color filter 93. The backlight source 91 comprises a plurality of single-chip LEDs, i.e. the above mentioned single-chip LED with three luminescent spectrums of red, blue and green wavelengths according to the present invention. According to the above embodiments described above, the backlight sources of red, green and blue wavelengths may be modulated to the narrow spectrums, and completely contained in the spectrum of the color filter 93, to obtain the most preferable efficiency adapted to the color filter 93.

Figure 10:
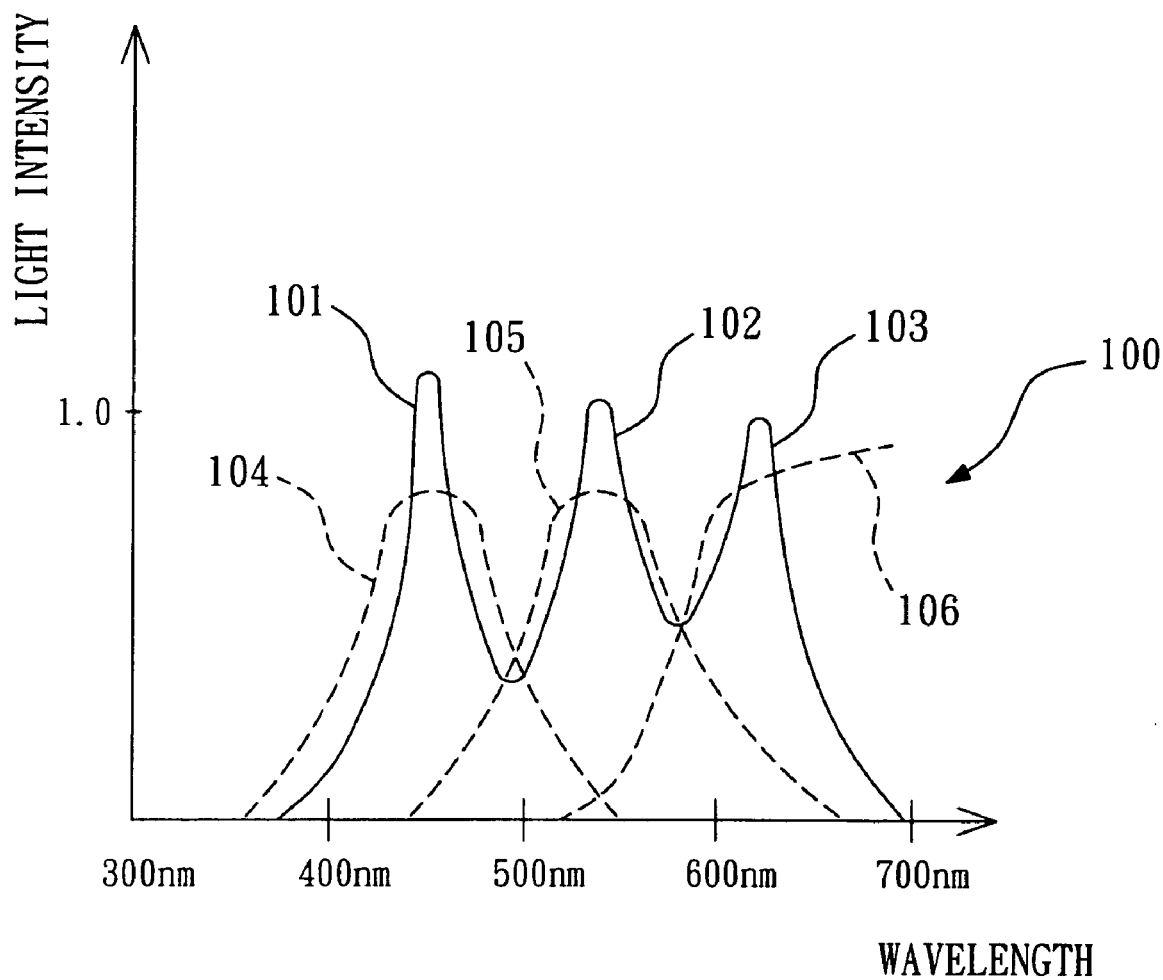
FIG. 10 a distribution view illustrating the light intensity and light spectrums of the backlight source and the color filter of the display according to the present invention.

Referring to FIG. 10, the luminescent spectrum distribution curve 100 of the backlight source 91 combined by the single-chip LED with three spectrums of red, blue and green wavelengths and the color filter 93 is shown, wherein the spectrum distribution curve of the backlight source 91 is provided with a blue light spectrum 10, a green light spectrum 102 and a red light spectrum 103, and the spectrum distribution curve of the color filter 93 is provided with a blue light spectrum 104, a green light spectrum 105 and a red light spectrum 106 (as shown with the dashed line). The backlight source 91 of three wavelengths of red, green and blue light may be adjusted to the narrow spectrum, and completely contained in the spectrum of the color filter 93, to obtain the most preferable efficiency adapted to the color filter 93. Taking the blue light spectrum 101 and the blue spectrum 104 as examples, the blue light spectrum 101 is a narrow spectrum and may be completely contemplated by the blue spectrum 104, thus achieving the most preferable efficiency.

Moreover, different displays may have different designs of the red, blue and green spectrums in the fabricating. For the single-chip LED with three luminescent spectrums of red, blue light and green wavelengths according to the present invention, the red, blue and green light spectrums with different wavelength properties may be fabricated depending on different displays in association with the designs from the manufacturer. Moreover, the single-chip LED with the three luminescent spectrums of red, blue and green wavelengths according to the present invention may be adjusted by utilizing the quantum-dot light-emitting layer to obtain the property of wide spectrum, so that such spectrums of the single-chip LED may be provided with the property of wide spectrum to be applied for the spectrum designs of different displays.

The substrate 31 of the single-chip light-emitting element in the previous embodiments of the present invention may be a first conductive substrate (N-type conductive substrate), a second conductive substrate, or an insulating substrate. The second conductive substrate may be a P-type conductive substrate, SiC, GaN, Si, and the like. The insulating substrate may be $Al_2O_3$, AlN, ZnO, and the like.

The red fluorescent powder used in the present invention may be a mixture of $LiEuW_2O_8$, $CaS:Eu^{2+}$, $SrS:Eu^{2+}$, $Ba_2Si_5N_8$, $Y_2O_2S:Eu^{3+}$, $Bi^{3+}$, $YVO_4:Eu^{3+}$, $Bi^{3+}$, $Y_2O_3:Eu^{3+}$, $Bi^{3+}$, and the like. Alternatively, the red fluorescent powder may be a mixture of $Y_2O_2S:Eu^{3+}$, $Bi^{3+}$, $YvO_4:Eu^{3+}$, $Bi^{3+}$, $Y_2O_3:Eu^{3+}$, $Bi^{3+}$, and the like.

The single-chip white light element of the single-chip LED is not limited to the amount and the sequence of the layers of the above mentioned embodiments, and may have the first blue light-emitting layer formed on the first conductive cladding layer, and a second blue light-emitting layer formed below the second conductive cladding layer, while a green light-emitting layer formed between the first blue light-emitting layer and the second blue light-emitting layer. Alternatively, it may have a first green light-emitting layer formed on the first conductive cladding layer, a second green light-emitting layer formed below the second conductive cladding layer, and a blue light-emitting formed between the first green light-emitting layer and the second green light-emitting layer. It may also have the green light-emitting layer and the blue light-emitting layer alternately formed between the first conductive cladding layer and the second conductive cladding layer, with the amount and sequence of the alternating layers being either regular or irregular.

While an embodiment of the present invention has been illustrated and described, various modifications and improvements can be made by those skilled in the art. The embodiment of the present invention is therefore described in an illustrative, but not restrictive, sense. It is intended that the present invention may not be limited to the particular forms as illustrated, and that all modifications which maintain the spirit and scope of the present invention are within the scope as defined in the appended claims.

What is claimed is:

1. A single-chip light-emitting diode (LED) with three luminescent spectrums of red, blue and green wavelengths, comprising:

a base;

two conductive pins;

a single-chip light-emitting element, disposed on the base and electrically connected to the two conductive pins;

a package material, for packaging the single-chip light-emitting element; and red fluorescent powder, added to the package material, with an emission wavelength ranging from 585 nm to 710 nm;

wherein the single-chip light-emitting element comprising:

a substrate, a N-type cladding layer;

a P-type cladding layer;

at least one green light-emitting layer, formed between the N-type cladding layer and the P-type cladding layer, with an emission wavelength ranging from 510 nm to 585 nm; and at least one blue light-emitting layer, formed between the N-type cladding layer and the P-type cladding layer, with an emission wavelength ranging from 400 nm to 495 nm.

2. The single-chip LED according to claim 1, wherein the blue light-emitting layer is formed below the P-type cladding layer, while the green light-emitting layer is formed above the N-type cladding layer.

3. The single-chip LED according to claim 2, wherein the blue light-emitting layer is a blue quantum-dot light-emitting layer, and the green light-emitting layer is a green quantum-dot light-emitting layer.

4. The single-chip LED according to claim 2, wherein the blue light-emitting layer is a blue quantum-dot light-emitting layer, and the green light-emitting layer is a green quantum-well light-emitting layer.

5. The single-chip LED according to claim 1, wherein the green light-emitting layer is formed below the P-type cladding layer, and the blue light-emitting layer is formed above the N-type cladding layer.

6. The single-chip LED according to claim 5, wherein the blue light-emitting layer is a blue quantum-dot light-emitting layer, and the green light-emitting layer is a green quantum-dot light-emitting layer.

7. The single-chip LED according to claim 5, wherein the blue light-emitting layer is a blue quantum-well light-emitting layer, and the green light-emitting layer is a green quantum-dot light-emitting layer.

8. The single-chip LED according to claim 1, wherein a first green light-emitting layer is formed below the P-type cladding layer, a second green light-emitting layer is formed above the N-type cladding layer, and the blue light-emitting layer is formed between the first green light-emitting layer and the second green light-emitting layer.

9. The single-chip LED according to claim 1, wherein a first blue light-emitting layer is formed below the P-type cladding layer, a second blue light-emitting layer is formed above the N-type cladding layer, and the green light-emitting layer is formed between the first green light-emitting layer and the second green light-emitting layer.

10. The single-chip LED according to claim 1, wherein the single-chip light-emitting element further comprises at least one UV light-emitting layer, which is formed between the N-type cladding layer and the P-type cladding layer.

11. The single-chip LED according to claim 10, wherein the UV light-emitting layer is formed below the P-type cladding layer, and the UV light-emitting layer is a quantum-dot light-emitting layer.

12. The single-chip LED according to claim 1, wherein the single-chip light-emitting element further comprises two electrodes, which are electrically connected to the two conductive pins, respectively.

13. The single-chip LED according to claim 1, wherein the red light of the red fluorescent powder is generated by the excitation of the blue light from the blue light-emitting layer, with the wavelength of the blue light from the blue light-emitting layer ranging from 400 nm to 495 nm.

14. The single-chip LED according to claim 1, wherein the red light of the red fluorescent powder is generated by the excitation of the green light from the green light-emitting layer, with the wavelength of the green light from the green light-emitting layer ranging from 510 nm to 585 nm.

15. The single-chip LED according to claim 1, wherein the red light of the red fluorescent powder is generated by the excitation of the blue light from the blue light-emitting layer and the green light from the green light-emitting layer, with the wavelength of the blue light from the blue light-emitting layer ranging from 400 nm to 495 mm, and the wavelength of the green light from the green-light-emitting layer ranging from 510 nm to 585 nm.

16. The single-chip LED according to claim 10, wherein the red light of the red fluorescent powder is generated by the excitation of the blue light from the blue light-emitting layer, the green light from the green light-emitting layer and the UV light from the UV light-emitting layer, with the wavelength of the UV light from the UV light-emitting layer ranging from 250 nm to 400 nm, the wavelength of the blue light from the blue light-emitting layer ranging from 400 nm to 495 nm, and the wavelength of the green light from the green light-emitting layer ranging from 510 nm to 585 nm.

17. A display, comprising:
a backlight source, having a plurality of the single-chip LEDs with the three luminescent spectrums of red, blue and green wavelengths according to claim 1;
a liquid crystal unit module; and
a color filter.

* * * * *